United States Patent
Sasaki

(10) Patent No.: US 12,220,748 B2
(45) Date of Patent: Feb. 11, 2025

(54) COATED CUTTING TOOL

(71) Applicant: MOLDINO Tool Engineering, Ltd., Tokyo (JP)

(72) Inventor: Tomoya Sasaki, Yasu (JP)

(73) Assignee: MOLDINO Tool Engineering, Ltd., Tokyo (JP)

(*) Notice: Subject to any disclaimer, the term of this patent is extended or adjusted under 35 U.S.C. 154(b) by 854 days.

(21) Appl. No.: 17/414,108

(22) PCT Filed: Dec. 10, 2019

(86) PCT No.: PCT/JP2019/048247
§ 371 (c)(1),
(2) Date: Jun. 15, 2021

(87) PCT Pub. No.: WO2020/194899
PCT Pub. Date: Oct. 1, 2020

(65) Prior Publication Data
US 2022/0040769 A1 Feb. 10, 2022

(30) Foreign Application Priority Data
Mar. 22, 2019 (JP) .................. 2019-055368

(51) Int. Cl.
*B32B 15/04* (2006.01)
*B23B 27/14* (2006.01)
(Continued)

(52) U.S. Cl.
CPC ........ *B23B 27/148* (2013.01); *C23C 14/0641* (2013.01); *B23B 2228/10* (2013.01); *C23C 14/34* (2013.01)

(58) Field of Classification Search
CPC .................................................. B32B 27/148
(Continued)

(56) References Cited

U.S. PATENT DOCUMENTS 5,700,551 A * 12/1997 Kukino ................. C23C 30/005
427/419.7
11,666,976 B2 * 6/2023 Isaka .................... C23C 14/0641
428/697
(Continued)

FOREIGN PATENT DOCUMENTS

CN 107206513 A 9/2017
CN 107923047 A 4/2018
(Continued)

OTHER PUBLICATIONS

Notice of Allowance mailed Sep. 28, 2021, issued for Japanese Patent Application No. 2021-508734 and English translation thereof.
(Continued)

*Primary Examiner* — Lauren R Colgan
(74) *Attorney, Agent, or Firm* — Locke Lord LLP; James E. Armstrong, IV; Nicholas J. DiCeglie, Jr.

(57) ABSTRACT

A coated cutting tool has a hard coating on a surface of a base material. The hard coating is a nitride of Al, Cr, and Si in which Al is 50 atom % or more, Cr is 30 atom % or more, and Si is 1 atom % or more and 5 atom % or less. The hard coating contains 0.02 atom % or less of Ar, and the atomic ratio A and the atomic ratio B of nitrogen satisfy the relationship of $1.02 \leq B/A \leq 1.10$, and a diffraction peak originating from the (111) plane of a face-centered cubic lattice structure shows the maximum intensity. In the cross-sectional observation of the hard coating, the number of droplets having an equivalent circle diameter of 3 μm or more is less than 1 per 100 μm². The surface of the hard coating has an arithmetical mean curvature Spc value of 5000 or less.

4 Claims, 1 Drawing Sheet

(51) Int. Cl.
    *B32B 17/06*     (2006.01)
    *C23C 14/06*     (2006.01)
    *C23C 14/34*     (2006.01)

(58) Field of Classification Search
    USPC .................................................. 428/701, 704
    See application file for complete search history.

(56) References Cited

U.S. PATENT DOCUMENTS

| | | | |
|---|---|---|---|
| 2015/0023751 A1* | 1/2015 | Andersson | B23C 5/20 |
| | | | 148/222 |
| 2017/0096733 A1* | 4/2017 | Sasaki | C23C 28/044 |
| 2019/0193165 A1* | 6/2019 | Takahashi | C23C 28/42 |
| 2019/0247930 A1* | 8/2019 | Tanaka | C23C 14/0641 |
| 2020/0198017 A1* | 6/2020 | Sasaki | B23B 51/00 |
| 2020/0230705 A1* | 7/2020 | Sasaki | B23D 77/00 |
| 2020/0255931 A1* | 8/2020 | Schier | C23C 14/0641 |
| 2020/0298316 A1* | 9/2020 | Sasaki | B23B 27/14 |
| 2020/0384551 A1* | 12/2020 | Yoshioka | C23C 30/005 |

FOREIGN PATENT DOCUMENTS

| | | |
|---|---|---|
| CN | 108689616 A | 10/2018 |
| CN | 108883481 A | 11/2018 |
| CN | 109070239 A | 12/2018 |
| EP | 3670043 A1 | 6/2020 |
| JP | 2005-344148 A | 12/2005 |
| JP | 2012-045650 A | 3/2012 |
| JP | 2012-092433 A | 5/2012 |
| JP | 2016-032861 A | 3/2016 |
| JP | 2016-078131 A | 5/2016 |
| KR | 10-2006-0046478 A | 5/2006 |
| KR | 10-2017-0003627 A | 1/2017 |
| KR | 10-2018-0127353 A | 11/2018 |
| WO | 2015/141743 A1 | 9/2015 |
| WO | 2019/035219 A1 | 2/2019 |
| WO | 2019/035220 A1 | 2/2019 |
| WO | 2019/054289 A1 | 3/2019 |
| WO | WO2019054289 * | 3/2019 |
| WO | WO2019065397 * | 4/2019 |

OTHER PUBLICATIONS

Supplementary European Search Report mailed Jul. 1, 2022, issued for European Patent Application No. 19921539.3.
Office Action mailed Jun. 20, 2023, issued for CN201980086962.4 and English translation of the Search Report.
Office Action mailed Sep. 19, 2023, issued for Korean Patent Application No. 10-2021-7018406 and English translation thereof.
International Search Report mailed Feb. 18, 2020, issued for PCT/JP2019/048247 and English translation thereof.

* cited by examiner

COATED CUTTING TOOL

TECHNICAL FIELD

The present invention relates to a coated cutting tool having a hard coating on a surface of a base material.

Priority is claimed on Japanese Patent Application No. 2019-055368, filed on Mar. 22, 2019, the content of which is incorporated herein by reference.

BACKGROUND ART

A nitride of AlCrSi is a kind of film excellent in wear resistance and heat resistance, and is widely applied to coated cutting tools. In general, the nitride of AlCrSi applied to coated cutting tools is coated by using an arc ion plating method, which has excellent adhesion to a base material among physical vapor deposition methods. However, in the arc ion plating method, since the target component is evaporated and coated by arc discharge, the hard coating inevitably contains a large amount of droplets of several micrometers. When a tool with a tool diameter of 3 mm or less, or even a small diameter tool of 1 mm or less is coated, the influence of droplets present on the surfaces of the hard coating on the tool diameter becomes large, and therefore the machining accuracy and tool life may not be sufficient. Further, in a usage environment where the load on the tool is large, the droplet present inside the hard coating may be the starting point, and the hard coating may be destroyed.

On the other hand, among the physical vapor deposition methods, the sputtering method in which the target component is sputtered with argon gas and coated is less likely to generate droplets, so that a smooth hard coating can be obtained. However, in the sputtering method, since the ionization rate of the target is lower than that in the arc ion plating method, voids are likely to be formed inside the hard coating, and the adhesion between the hard coating and the base material tends to be poor. As a means for increasing the ionization rate of a target in a sputtering method, there is known an unbalanced magnetron sputtering method in which a magnetic field balance is intentionally disturbed to extend a part of lines of magnetic force to a base material side. For example, Patent Document 1 discloses that a nitride of AlCrSi is coated by an unbalanced magnetron sputtering method.

Further, in recent years, a coated cutting tool coated with nitride of AlCrSi by a high-power sputtering method in which the electric power applied to the target is instantaneously increased has also been proposed. For example, in the method disclosed in Patent Document 2, an interlayer coating made of a fine Ti compound is formed on the surface of a base material by a sputtering method in which the maximum power applied to a Ti target is 0.1 to 0.2 MW. Next, the nitride of AlCrSi on the interlayer coating is coated with the electric power applied to the target at 4 kW by the sputtering method.

CITATION LIST

Patent Documents

[Patent Document 1]
Japanese Unexamined Patent Application, First Publication No. 2005-344148

[Patent Document 2]
Japanese Unexamined Patent Application, First Publication No. 2012-092433

SUMMARY OF INVENTION

Technical Problem

As described in Patent Documents 1 and 2, by coating by a sputtering method, a nitride of AlCrSi containing no coarse droplet inside the hard coating can be obtained. However, the hard coating coated by the sputtering method is not sufficiently densified as compared with the hard coating coated by the arc ion plating method, and inevitably contains a large amount of Ar. Therefore, the coated cutting tool coated with the nitride of AlCrSi by the sputtering method, which has been conventionally proposed, tends to be inferior in tool damage and durability compared with the coated cutting tool coated with the nitride of AlCrSi by the arc ion plating method, and there is room for improvement.

In view of the foregoing, it is an object of the present invention to provide a coated cutting tool which is excellent in durability by improving the durability of a nitride of AlCrSi coated by a sputtering method.

Solution to Problem

According to an aspect of the present invention, there is provided a coated cutting tool having a hard coating on a surface of a base material, in which the hard coating is a nitride of Al, Cr, and Si in which Al is 50 atom % or more, Cr is 30 atom % or more, and Si is 1 atom % or more and 5 atom % or less with respect to a total amount of metal (including metalloid) elements, and Ar is 0.02 atom % or less with respect to the total amount of metal (including metalloid) elements and non-metal elements, an atomic ratio A of a metal (including metalloid) element and an atomic ratio B of nitrogen in the hard coating satisfy a relationship of $1.02 \leq B/A \leq 1.10$, in a case where a total of the metal (including metalloid) element, nitrogen, oxygen, carbon, and Ar is set to 100 atom %, in an intensity profile of a selected-area diffraction pattern using X-ray diffraction or a transmission electron microscope, a diffraction peak originating from a (111) plane of a face-centered cubic lattice structure exhibits a maximum intensity, in a cross-sectional observation of the hard coating, the number of droplets having an equivalent circle diameter of 3 μm or more is less than 1 per 100 μm$^2$, and a surface of the hard coating has an arithmetical mean curvature Spc (1/mm) value at a peak point, as defined by ISO25178, of 5000 or less.

The surface of the hard coating preferably has a maximum height Sz as defined by ISO25178 of 2.0 μm or less.

The surface of the hard coating preferably has a skewness (Ssk) value as defined by ISO25178 of −1.5 or more and 0 or less.

Advantageous Effects of Invention

According to the present invention, the durability of the coated cutting tool can be improved.

DESCRIPTION OF EMBODIMENTS

Figure 1:
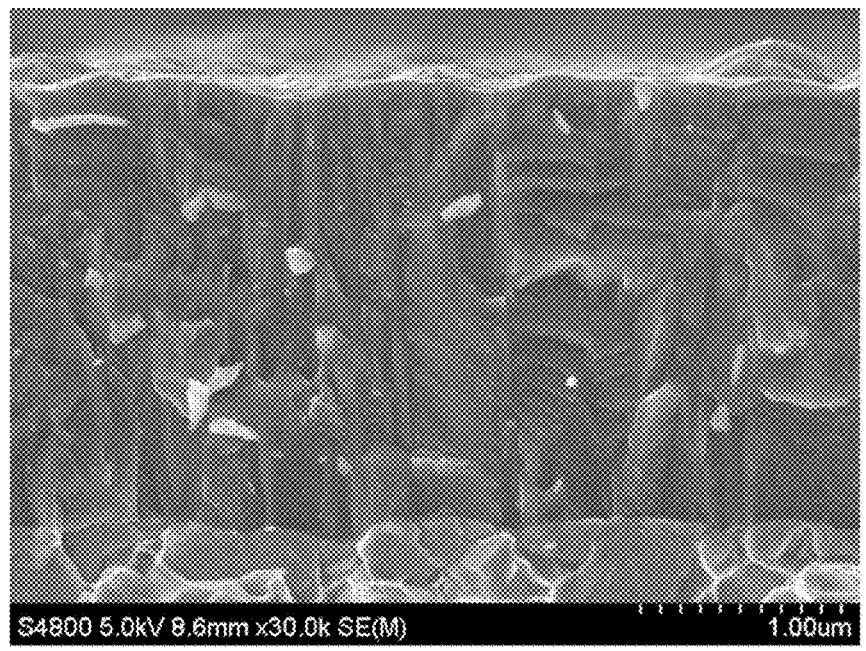
FIG. 1 is a cross-sectional observation photograph (30000× magnification) of Example 1 using an electron microscope.

The present inventors have confirmed that the nitride of AlCrSi formed by the sputtering method can be a coated cutting tool excellent in durability by increasing the content ratio of nitrogen, decreasing the content ratio of argon, and decreasing the "sharpness" of the surface of the hard coating.

Hereinafter, the details of the embodiment of the present invention will be described.

The coated cutting tool of the present embodiment is a coated cutting tool having a hard coating made of nitride of AlCrSi on a surface of the tool.

Details of the component composition, structure, characteristics, manufacturing method, and the like of the hard coating constituting the coated cutting tool of the present embodiment will be described.

<Component Composition: Aluminum (Al), Chromium (Cr), Silicon (Si)>

The hard coating according to the present embodiment is a nitride of Al, Cr, and Si in which Al is 50 atom % or more, Cr is 30 atom % or more, and Si is 1 atom % or more and 5 atom % or less with respect to the total amount of metal elements including metalloids (hereinafter referred to as metal elements).

A nitride of AlCrSi is a kind of film excellent in balance between wear resistance and heat resistance, and is excellent adhesion to a base material, and in particular, increasing the Al content ratio further improves the heat resistance of the hard coating. Further, by increasing the Al content ratio, an oxidation protective film is easily formed on the tool surface, and the coat structure becomes finer, so that wear of the hard coating due to welding is easily suppressed. Further, by increasing the Al content ratio, the cutting resistance tends to decrease. In order to sufficiently exert the above-mentioned effect of adding Al, in the hard coating according to the present embodiment, the Al content ratio is set to 50 atom % or more in a case where the entire metal element is set to 100 atom %. Furthermore, it is preferable that the Al content ratio is set to 55 atom % or more. On the other hand, when the Al content ratio becomes too large, the crystal structure of the hard coating tends to have a hexagonal close-packed structure (hcp structure) and becomes fragile. Therefore, in the hard coating according to the present embodiment, the Al content ratio is preferably set to 65 atom % or less in a case where the entire metal element is set to 100 atom %. Furthermore, the Al content ratio is preferably set to 60 atom % or less.

In the hard coating according to the present embodiment, the Cr content ratio is set to 30 atom % or more in a case where the entire metal element is set to 100 atom %. As a result, excellent wear resistance can be imparted to the hard coating. Furthermore, the Cr content ratio is preferably set to 35 atom % or more. On the other hand, when the Cr content ratio contained in the hard coating becomes too large, it is difficult to obtain the above-mentioned effect of increasing the Al content ratio. Therefore, in the hard coating according to the present embodiment, the Cr content ratio is preferably set to 48 atom % or less in a case where the entire metal element is set to 100 atom %. Furthermore, the Cr content ratio is preferably set to 45 atom % or less.

In the hard coating according to the present embodiment, the Si content ratio is set to 1 atom % or more and 5 atom % or less in a case where the total metal element is set to 100 atom %. When the nitride of Al and Cr contains Si, the coat structure becomes fine and the wear resistance and heat resistance are improved. In order to sufficiently exert the above-mentioned effect of adding Si, in the hard coating according to the present embodiment, the Si content ratio is set to 1 atom % or more in a case where the entire metal element is set to 100 atom %. On the other hand, when the Si content ratio becomes too large, the coat structure becomes fine and the crystal grain boundaries increase. Since later-described Ar is likely to be present at the crystal grain boundary of the hard coating, when the crystal grain boundary increases, Ar contained in the hard coating increases, and the durability of the coated cutting tool decreases. Further, when the Si content ratio becomes large, the film structure tends to be a hexagonal close-packed structure (hcp structure) or amorphous, and the durability of the coated cutting tool decreases. Therefore, the hard coating according to the present embodiment, the Si content ratio is set to 5 atom % or less in a case where the total metal element is set to 100 atom %. Furthermore, the Si content ratio is preferably set to 3 atom % or less.

The metal element content ratio of the hard coating according to the present embodiment can be measured for the mirror-finished hard coating using an electron probe microanalyzer (EPMA). In this case, for example, after the surface of the hard coating is mirror-finished, the analysis range of about 1 μm in diameter can be analyzed at five points, and can be obtained from the average of three points excluding the maximum value and the minimum value.

<Argon (Ar) Content>

The hard coating according to the present embodiment contains 0.02 atom % or less of argon (Ar) with respect to the total amount of metal elements and non-metal elements. The occurrence frequency of coarse droplets that become defects of the hard coating can be reduced by applying a sputtering method. On the other hand, in the sputtering method, since the target component is sputtered using argon ions, the hard coating coated by the sputtering method may contain argon. In particular, argon tends to be concentrated at the crystal grain boundaries of the hard coating, and the content ratio of argon tends to increase as the crystal grain size becomes finer. However, when the argon content ratio becomes large, the bonding force between the particles decreases at the crystal grain boundaries. As with the hard coating according to the present embodiment, even with respect to the nitride of AlCrSi, argon contained in excess becomes a defect, so it is effective to keep the content ratio below a certain level. Specifically, the hard coating according to the present embodiment contains 0.02 atom % or less of argon with respect to the total amount of metal elements and non-metal elements. The hard coating according to the present embodiment preferably contains 0.01 atom % or less of argon with respect to the total amount of metal elements and non-metal elements. The range in which the argon content ratio of the hard coating is 0.02 atom % or less or 0.01 atom % or less includes a range in which it is difficult to accurately evaluate the value due to the detection limit of the measuring device. Such a trace amount of content is at the same level as a hard coating coated by an arc ion plating method without using argon. The hard coating according to the present embodiment may contain 0.003 atom % or more of argon with respect to the total amount of metal elements and non-metal elements.

The argon content ratio of the hard coating according to the present embodiment can be measured for the mirror-finished hard coating using an electron probe microanalyzer (EPMA) in the same manner as the above-mentioned measurement of the metal element content ratio. Similar to the above-mentioned measurement of the content ratio of the metal element, after mirror-finishing, the analysis range of about 1 µm in diameter can be analyzed at five points, and can be obtained from the average of three points excluding the maximum value and the minimum value.

In the hard coating according to the present embodiment, trace amounts of argon, oxygen, and carbon may be contained as non-metal elements in addition to nitrogen. The argon content ratio in the hard coating can be determined by setting the content ratio of the metal (including metalloid) element and nitrogen, oxygen, carbon, and argon to 100 atom %.

<Atomic Ratio A of Metal (Including Metalloid) Element and Atomic Ratio B of Nitrogen>

In the hard coating according to the present embodiment, the atomic ratio A of a metal (including metalloid) element and the atomic ratio B of nitrogen in the hard coating satisfy a relationship of $1.02 \leq B/A \leq 1.10$, in a case where the content ratio of the metal (including metalloid) element, nitrogen, oxygen, carbon, and argon is set to 100 atom %. As the values of the atomic ratios A and B, values measured by EPMA by the above-described measurement method are used. By increasing the nitrogen content ratio in consideration of oxygen, carbon, and argon that may be contained in the hard coating in a trace amount, the heat resistance of the hard coating can be further improved, and the durability of the coated cutting tool can be increased.

When the value of B/A is less than 1.02, it is difficult to sufficiently form a complete nitride, and thus the microstructure and composition of the hard coating tend to be non-uniform, and the durability of the coated cutting tool tends to decrease. Further, when the value of B/A is larger than 1.10, the residual compressive stress becomes high and the hard coating is liable to cause self-destruction.

A more preferable range of B/A is $1.03 \leq B/A \leq 1.08$.

<Component Composition: Oxygen (O), Carbon (C)>

Although the hard coating according to the present embodiment is a nitride, it may contain a trace amount of oxygen and carbon. Since these elements form trace amounts of oxides and carbides in the nitride, the toughness of the hard coating can be reduced. When oxygen and carbon inevitably contained in the hard coating can be reduced, the toughness of the nitride mainly composed of Al and Cr can be increased.

In the hard coating according to the present embodiment, the oxygen content ratio is preferably set to 1.5 atom % or less in order to minimize the amount of fine oxides contained in the hard coating. Furthermore, the oxygen content ratio is preferably set to 1.0 atom % or less. Further, in order to minimize the amount of fine carbides contained in the hard coating, the carbon content ratio is preferably set to 1.5 atom % or less. Furthermore, the carbon content ratio is preferably set to 1.0 atom % or less.

The content ratio of oxygen and carbon may be determined by setting the total content ratio of carbon, nitrogen, oxygen, argon, and metal (including metalloid) elements to 100 atom %.

<Crystal Structure>

In the hard coating according to the present embodiment, in an intensity profile of a selected-area diffraction pattern using X-ray diffraction or a transmission electron microscope, a diffraction peak originating from a (111) plane of a face-centered cubic lattice structure (fcc) exhibits a maximum intensity. That is, the hard coating according to the present embodiment has a crystal structure mainly composed of an fcc structure. By applying a nitride mainly composed of Al and Cr of which diffraction peak originating from the (111) plane exhibits the maximum intensity, the durability of the coated cutting tool tends to be excellent.

In the intensity profile of the diffraction pattern, the hard coating according to the present embodiment has peak intensities of the (200) plane of the fcc structure and the (220) plane of the fcc structure in addition to the peak intensity of the (111) plane of the fcc structure. In the hard coating according to the present embodiment, a diffraction peak of a hexagonal close-packed structure (hcp structure) is not observed in X-ray diffraction, but a diffraction peak of an hcp structure may be partially observed in an intensity profile of a selected-area diffraction pattern using a transmission electron microscope.

<Droplet>

In the hard coating according to the present embodiment, in a cross-sectional observation, the number of droplets having an equivalent circle diameter of 3 µm or more is less than 1 per 100 µm$^2$. In the present embodiment, the content ratio of Ar contained in the hard coating is decreased, and then the droplets contained inside the hard coating are reduced. In the hard coating coated by the physical vapor deposition method, the droplets may be a main physical defect. In particular, in the case of a small diameter tool having a tool diameter of 3 mm or less, and further 1 mm or less, the degree of influence of droplets on tool performance increases, and therefore, by reducing the occurrence frequency of coarse droplets, the durability of the coated cutting tool can be improved. In particular, extremely large droplets can be a starting point for large fractures even when they are present in a small amount inside the hard coating. Therefore, in the present embodiment, in the cross-sectional observation of the hard coating, the number of droplets having an equivalent circle diameter of 3 µm or more is set to less than one per 100 µm$^2$. Furthermore, in the cross-sectional observation, it is preferable that there are no droplets having an equivalent circle diameter of 5 µm or more.

In the present embodiment, in the cross-sectional observation of the hard coating, the number of droplets having an equivalent circle diameter of 1 µm or more is preferably set to five or less per 100 µm$^2$. Furthermore, in the cross-sectional observation, the number of droplets having an equivalent circle diameter of 1 µm or more is preferably set to three or less per 100 µm$^2$.

The equivalent circle diameter is the diameter of a perfect circle having the same area as the droplet area in cross-sectional observation.

In order to evaluate the droplet in the cross-sectional observation of the hard coating, the hard coating is mirror-finished and then processed into a sample by a focused ion beam method, and the mirror-finished surface of the hard coating is observed using an electron microscope. In the evaluation, a plurality of visual fields may be observed at a magnification of 5,000× to 10,000×.

On the surface of the coated cutting tool according to the present embodiment, the arithmetical mean height Sa is set to 0.1 µm or less, the maximum height Sz is set to 3.0 µm or less, and the arithmetical mean curvature Spc value at the peak point (1/mm) as defined by ISO25178 is set to 5000 or less.

The present inventors have found that smoothing only the arithmetical mean roughness Ra and the maximum height roughness Rz, which are surface roughnesses in general line evaluation, may increase variations in tool performance, and it is important to control the surface roughness in wider surface evaluation. Then, the present inventor has found that it is effective to control the arithmetical mean curvature Spc at the peak point in addition to the arithmetical mean height Sa and the maximum height Sz defined by the surface evaluation ISO25178. Here, the arithmetical mean curvature Spc at the peak point is an index of the degree of sharpness at the peak point. It is indicated that when the arithmetical mean curvature Spc value at the peak point is small, the peak point in contact with another object is rounded. It is indicated that when the arithmetical mean curvature Spc value at the peak point is large, the peak point in contact with another object is sharp. By making the arithmetical mean curvature Spc value at the peak point smaller on the surface of the coated cutting tool, the "sharpness" of the surface of the flank face becomes smaller, and wear is more easily suppressed. By setting the arithmetical mean height Sa to 0.1 μm or less and the maximum height Sz to 3.0 μm or less for the surface of the coated cutting tool according to the present embodiment, the surface becomes a smooth surface state. Furthermore, with respect to the surface of the coated cutting tool according to the present embodiment, by setting the arithmetical mean curvature Spc (1/mm) value at the peak point to 5000 or less, the "sharpness" of the surface of the flank face is further reduced, and wear is easily suppressed. Further, it is preferable that the arithmetical mean curvature Spc (1/mm) value at the peak point is 3000 or less. The maximum height Sz is preferably 2.0 μm or less.

In order to achieve such a surface state, it is preferable that after the tool is coated with the hard coating by the sputtering method, the tool is further subjected to a wet blast treatment or a cutting edge treatment by injecting an abrasive or the like.

Further, in the coated cutting tool according to the present embodiment, the skewness (Ssk) value as defined by ISO25178 is preferably −1.5 or more and 0 or less. Skewness (Ssk) is an index showing the relativity of the height distribution. When there are many droplets in the hard coating, the number of protrusions increases, and the skewness (Ssk) value becomes larger than 0. On the other hand, when the hard coating has many recesses, the skewness (Ssk) value becomes smaller than 0. When a hard coating having many droplets is polished, the protrusions are polished, and the skewness (Ssk) value becomes smaller than 0, but when the droplets are removed, large recesses are formed, and the skewness (Ssk) value increases to the negative side. By setting the skewness (Ssk) value to −1.5 or more and 0 or less, the surface becomes a smoother surface state with less unevenness, which is preferable. Further, the skewness (Ssk) value is more preferably −1.0 or more and 0 or less. In order to achieve such a surface state, it is preferable that after the tool is coated with the hard coating by the sputtering method, the tool is further subjected to a wet blast treatment or a cutting edge treatment by injecting an abrasive or the like.

The roughness of the flank face of these coated cutting tools is related to the surface of the hard coating formed on the flank face.

The surface roughness of the coated cutting tool according to the present embodiment can be determined from the average of the measurement values obtained by measuring three 60 μm×100 μm regions by observing at a cut-off value of 0.25 mm and magnification of 50× using a shape analysis laser microscope (VK-X250) manufactured by KEYENCE CORPORATION.

<Interlayer Coating>

In the coated cutting tool of the present embodiment, in order to further improve the adhesion of the hard coating, an interlayer coating may be provided between the base material of the tool and the hard coating, if necessary. For example, a layer made of any of metal, nitride, carbonitride, and carbide may be provided between the base material of the tool and the hard coating. Further, a hard coating may be provided directly above the base material without providing an interlayer coating.

In the coating process of the hard coating according to the present embodiment, a sputtering method is applied in which three or more AlCrSi alloy targets are used, electric power is sequentially applied to the targets, and when the target to which electric power is applied is switched, a time during which electric power is simultaneously applied to both the target to which the application of electric power is ended and the target to which the application of electric power is started is provided. In such a sputtering method, a state in which the ionization rate of the target is high is maintained during coating, and a dense hard coating at a micro level is obtained, and there is a tendency that the content of argon, oxygen, and carbon which are inevitably contained is small and the content ratio of nitrogen is high. It is preferable that preliminary discharge be performed with the temperature inside the furnace in the sputtering apparatus set to 400° C. or more and 500° C. or less, the flow rate of nitrogen gas introduced into the sputtering apparatus set to 60 sccm or more, and the flow rate of argon gas introduced into the sputtering apparatus set to 70 sccm or more and 200 sccm or less. Further, the pressure in the furnace is preferably set to 0.5 Pa to 0.8 Pa. In the AlCrSi alloy target, when the discharge time per cycle of the applied electric power becomes long, the risk of arcing becomes high, and the film formation tends to be difficult to stabilize. Therefore, the discharge time per cycle of the electric power applied to the AlCrSi alloy target is preferably 1.0 milliseconds or less.

Preferably, the maximum power density of the power pulse is 0.5 kW/cm$^2$ or more. However, when the power density applied to the target becomes too large, it is difficult to stabilize the film formation. Further, when the power density becomes too high, the occurrence frequency of droplet generation tends to increase even in the sputtering method. Therefore, the maximum power density of the power pulse is preferably 3.0 kW/cm$^2$ or less, and more preferably 2.0 kW/cm$^2$ or less. Further, it is preferable that the time during which electric power is simultaneously applied to both of the alloy target to which the application of electric power is ended and the alloy target to which the application of electric power is started is 5 microseconds or more and 20 microseconds or less in order to improve the basic characteristics of the hard coating and reduce the droplets.

Example 1

<Tools>

As a tool, a cutting edge replaceable tool (manufactured by Mitsubishi Hitachi Tool Engineering, Ltd.) made of cemented carbide having a composition of WC (bal.)-Co (8% by weight)-V (0.3% by weight)-Cr (0.4% by weight) and a hardness of 94.0 HRA (Rockwell hardness, a value measured according to JIS G 0202) was prepared.

In Examples 1 to 3 and Comparative Examples 1 to 3, a sputtering apparatus capable of mounting six sputtering evaporation sources was used. Of these vapor deposition sources, three AlCrSi alloy targets were installed in the apparatus as vapor deposition sources. A target having a size of Φ16 cm and a thickness of 12 mm was used.

The tool was fixed to the sample holder in the sputtering apparatus and a bias power supply was connected to the tool. The bias power supply had a structure in which a negative bias voltage is applied to the tool independently of the target. The tool rotates at two revolutions per minute and revolves via a fixing jig and a sample holder. The distance between the tool and the target surface was 100 mm.

As the introduction gas, Ar and $N_2$ were used, and the introduction gas was introduced from the gas supply port provided in the sputtering apparatus.

<Bombardment Treatment>

First, before coating the tool with a hard coating, the tool was subjected to a bombardment treatment according to the following procedure. Heating was performed for 30 minutes in a state where the temperature inside the furnace was 450° C. by the heater in the sputtering apparatus. Thereafter, the inside of the furnace of the sputtering apparatus was evacuated, and the pressure inside the furnace was set to $5.0 \times 10^{-3}$ Pa or less. Then, Ar gas was introduced into the furnace of the sputtering apparatus, and the pressure inside the furnace was adjusted to 0.8 Pa. Then, a DC bias voltage of −200 V was applied to the tool to perform cleaning (bombardment treatment) of the tool with Ar ions.

<Coating Process of Hard Coating>

Then, the nitride of AlCrSi was coated on the tool by the following procedure.

While maintaining the temperature inside the furnace at 450° C., Ar gas was introduced into the furnace of the sputtering apparatus at 160 sccm, and thereafter $N_2$ gas was introduced into the furnace at 190 sccm to bring the pressure in the furnace to 0.7 Pa. A DC bias voltage of −40 V was applied to the tool, and with the discharge time per cycle of the electric power applied to the AlCrSi alloy target being set to 0.5 milliseconds, and the time during which electric power is simultaneously applied to both of the alloy target to which the application of electric power is ended and the alloy target to which the application of electric power is started when the alloy target to which the electric power is applied is switched being set to 10 microseconds, three AlCrSi alloy targets were continuously applied with power to coat the surface of the tool with a hard coating of about 3.0 μm. At this time, the maximum power density of the power pulse was $1.0 \text{ kW/cm}^2$, and the average power density was $0.2 \text{ kW/cm}^2$.

In Examples 1 to 3, after coating the hard coating, an abrasive was injected for about 60 seconds to perform cutting edge treatment.

In Comparative Examples 1 to 3, the cutting edge treatment was not performed after coating the hard coating.

In Comparative Examples 4 to 6, an arc ion plating apparatus was used. An AlCrSi alloy target was installed in the apparatus as a vapor deposition source. A target having a size of Φ105 mm and a thickness of 16 mm was used. In the same manner as in Example 1, cleaning of the tool (bombardment treatment) with Ar ions was carried out. Next, the pressure inside the furnace in the arc ion plating apparatus was evacuated to $5.0 \times 10^{-3}$ Pa or less, the temperature inside the furnace was set to 500° C., and $N_2$ gas was introduced so that the pressure inside the furnace was 5.0 Pa. Next, a DC bias voltage of −150 V was applied to the tool, and a current of 150 A was applied to the AlCrSi alloy target to coat the surface of the tool with a hard coating of about 3.0 μm.

In Comparative Examples 4 to 6, after coating the hard coating, an abrasive was sprayed for about 60 seconds to perform cutting edge treatment.

<Coat Composition>

The coat composition of the hard coating was measured using an electron probe microanalyzer (JXA-8500 F manufactured by JEOL Co., Ltd.) using the attached wavelength-dispersive electron probe microanalysis (WDS-EPMA). The ball end mill for evaluating the physical properties was mirror-finished, the acceleration voltage was set to 10 kV, the irradiation current was set to $5 \times 10^{-8}$ A, and the take-in time was set to 10 seconds, and the composition of the hard coating was determined from the average values of three points excluding the maximum value and the minimum value by measuring five points in a diameter range of 1 μm in the analysis region.

<Crystal Structure/Crystal Grain Size>

The crystal structure of the hard coating was observed using an X-ray diffractometer (EMPYREA manufactured by PANalytical Corporation) under measurement conditions of a tube voltage of 45 kV, a tube current of 40 mA, an X-ray source of Cuk α ($\lambda=0.15405$ nm), and 2θ of 20° to 80°. Further, the average crystal grain size of the hard coating was measured from the half-value range of the maximum diffraction peak intensity of the hard coating. Further, in a case where the diffraction peak intensity of the (200) plane of the hard coating was defined as I(200) and the diffraction peak intensity of the (111) plane of the hard coating was defined as I(111), I(111)/I(200) was calculated.

<Surface Roughness>

The arithmetical mean height Sa, the maximum height Sz, the skewness (Ssk), and the arithmetical mean curvature of peak point Spc (1/mm) of the hard coating on the flank face were determined from the average of the measurement values obtained by measuring three 60 μm×100 μm regions by observing at a cut-off value of 0.25 mm and a magnification of 50× using a shape analysis laser microscope (VK-X250) manufactured by KEYENCE CORPORATION in accordance with the regulations of ISO25178.

<Cutting Test>

A cutting test was conducted using the prepared coated cutting tool. Table 1 shows the analysis results and cutting test results. The cutting conditions are as follows.

<Cutting Test>

(Condition) Dry processing
Tool: 2-flute carbide ball end mill
Model number: EPDBE2010-6, tool radius 0.5 mm
Cutting method: Bottom cutting
Work material: STAVAX (52HRC) (manufactured by Bohler-Uddeholm Co., Ltd.)
Cut: 0.04 mm in the axial direction and 0.04 mm in the radial direction
Cutting speed: 75.4 m/min
Single blade feed amount: 0.018 mm/blade
Cutting distance: 15 m
Evaluation method: After cutting, the work material was observed with a scanning electron microscope at an observation magnification of 1000× to measure the width of abrasion between the tool and the work material, and the portion having the largest abrasion width was defined as the maximum wear width. For each sample, the coat characteristics and coat structure were observed. Table 1 shows the coat characteristics and the results of cutting evaluation.

<Surface Roughness>

The arithmetical mean height Sa, the maximum height Sz, the skewness (Ssk), and the arithmetical mean curvature of peak point Spc (1/mm) of the hard coating on the flank face were determined from the average of the measurement values obtained by measuring three 60 μm×100 μm regions by observing at a cut-off value of 0.25 mm and a magnification of 50× using a shape analysis laser microscope (VK-X250) manufactured by KEYENCE CORPORATION in accordance with the regulations of ISO25178.

<Cutting Test>

Figure 2:
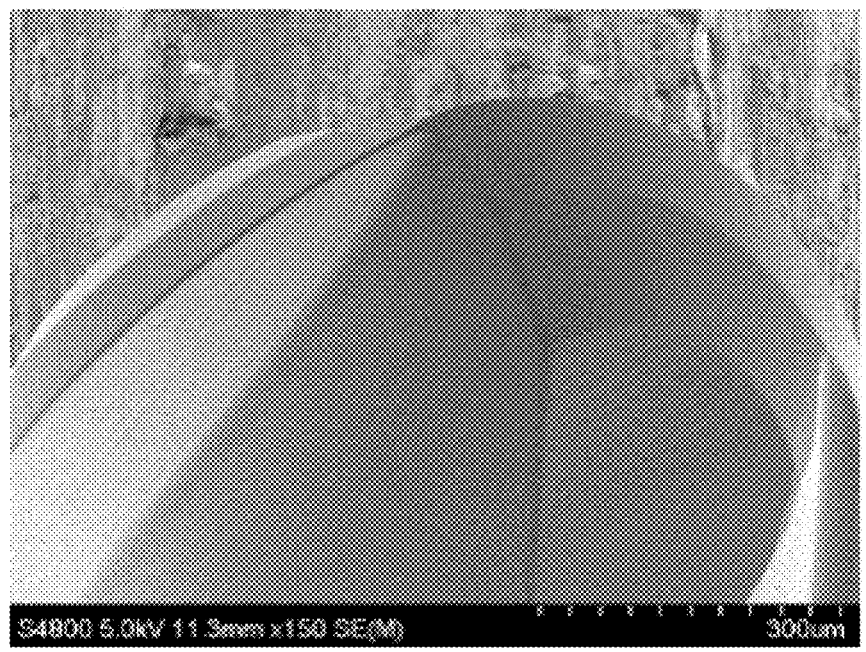
FIG. 2 is a surface observation photograph (150× magnification) in the vicinity of a tool using an electron microscope of Example 1.

A cutting test was conducted using the prepared coated cutting tool. Table 1 shows the analysis results and cutting test results. The cutting conditions are as follows. As a measurement example, FIG. 1 shows a cross-sectional observation photograph of the hard coating of the present Example 1, and FIG. 2 shows a surface observation photograph of the coated cutting tool of the present Example 1 before the cutting test. FIG. 1 is a photograph taken in identifying droplets in the hard coating. FIG. 2 is a low-magnification photograph taken in the measurement of the abrasion width after cutting.

<Cutting Conditions>

(Condition) Dry processing
Tool: 2-flute carbide ball end mill
Model number: EPDBE2010-6, tool radius 0.5 mm
Cutting method: Bottom cutting
Work material: STAVAX (52HRC) (manufactured by Bohler-Uddeholm Co., Ltd.)
Cut: 0.04 mm in the axial direction and 0.04 mm in the radial direction
Cutting speed: 75.4 m/min
Single blade feed amount: 0.018 mm/blade
Cutting distance: 15 m
Evaluation method: After cutting, the work material was observed with a scanning electron microscope at an observation magnification of 1000× to measure the width of abrasion between the tool and the work material, and the portion having the largest abrasion width was defined as the maximum wear width. For each sample, the coat characteristics and coat structure were observed. Table 1 shows the coat characteristics and the results of cutting evaluation.

no coarse droplets having an equivalent circle diameter of 1 μm or more contained in the hard coating. Comparative Examples 4 to 6 were coated cutting tools provided with a nitride of AlCrSi coated by the arc ion plating method currently applied on the market.

In Examples 1 to 3, the maximum wear width was smaller than that in Comparative Examples 1 to 6, and the tool wear was in a stable state of damage with less bias. It is estimated that in Examples 1 to 3, the arithmetical mean curvature Spc (1/mm) value was small due to smoothing by spraying an abrasive after coating by a sputtering method in which droplets are less likely to be generated, and thus the tool damage state was stable. Since Comparative Examples 4 to 6 were coated by the arc ion plating method, there were many coarse droplets on the surface of the hard coating. Therefore, the arithmetical mean curvature Spc (1/mm) value was larger than that in Examples 1 to 3 even when an abrasive was sprayed and smoothing was performed in the same manner as in Examples 1 to 3. It is estimated that the maximum wear width was increased as compared with Examples 1 to 3 as a result.

What is claimed is:

1. A coated cutting tool comprising a hard coating on a surface of a flank face, wherein the hard coating is a nitride of Al, Cr, and Si in which Al is 50 atom % or more, Cr is 30 atom % or more, and Si is 1 atom % or more and 5 atom % or less with respect to a total amount of metal elements including metalloid elements, and Ar is 0.02 atom % or less with respect to the total amount of metal elements including metalloid elements and non-metal elements, in a case where a total amount of the metal elements including metalloid elements, nitrogen, oxygen, carbon, and Ar is set to 100 atom %, an atomic ratio A of a total amount of the metal elements including metal-

TABLE 1

| No. | Coating composition (atom %) | Ar content ratio (atom %) | B/A | Crystal structure | (111)/(200) | Crystal grain size (nm) | Arithmetical mean height Sa (μm) | Maximum height Sz (μm) | Skewness Ssk | Arithmetical mean curvature Spc at peak point (1/mm) | Cutting performance Maximum wear width (μm) |
|---|---|---|---|---|---|---|---|---|---|---|---|
| Example 1 | (Al58Cr40Si2)N | less than 0.01 | 1.06 | fcc(111) | 1.33 | 15 | 0.06 | 1.82 | −0.47 | 3181 | 15 |
| Example 2 | (Al58Cr40Si2)N | less than 0.01 | 1.06 | fcc(111) | 1.33 | 15 | 0.07 | 2.36 | −1.24 | 4882 | 15 |
| Example 3 | (Al58Cr40Si2)N | less than 0.01 | 1.06 | fcc(111) | 1.33 | 15 | 0.07 | 1.53 | −0.35 | 2972 | 15 |
| Comparative Example 1 | (Al58Cr40Si2)N | less than 0.01 | 1.06 | fcc(111) | 1.33 | 15 | 0.12 | 2.66 | −0.04 | 11551 | 20 |
| Comparative Example 2 | (Al58Cr40Si2)N | less than 0.01 | 1.06 | fcc(111) | 1.33 | 15 | 0.11 | 3.83 | −0.11 | 13231 | 20 |
| Comparative Example 3 | (Al58Cr40Si2)N | less than 0.01 | 1.06 | fcc(111) | 1.33 | 15 | 0.10 | 1.24 | 0.06 | 7066 | 20 |
| Comparative Example 4 | (Al58Cr40Si2)N | less than 0.01 | — | fcc(200) | 0.72 | 13 | 0.08 | 3.34 | −0.88 | 5316 | 20 |
| Comparative Example 5 | (Al58Cr40Si2)N | less than 0.01 | — | fcc(200) | 0.72 | 13 | 0.10 | 3.63 | −2.00 | 10049 | 20 |
| Comparative Example 6 | (Al58Cr40Si2)N | less than 0.01 | — | fcc(200) | 0.72 | 13 | 0.08 | 1.77 | −0.73 | 5876 | 20 |

Although Examples 1 to 3 and Comparative Examples 1 to 3 were coated by the sputtering method, the hard coating contained almost no argon as in Comparative Examples 4 to 6 coated by the arc ion plating method. Further, in Examples 1 to 3 and Comparative Examples 1 to 3, there were almost loid elements and an atomic ratio B of nitrogen in the hard coating satisfy a relationship of 1.02≤B/A≤1.10, in an intensity profile of a selected-area diffraction pattern using X-ray diffraction or a transmission electron microscope, a diffraction peak originating from a (111) plane of a face-centered cubic lattice structure exhibits a maximum intensity, in a cross-sectional observation of the hard coating, the number of droplets having an equivalent circle diameter of 3 μm or more is less than 1 per 100 μm$^2$, and a surface of the hard coating formed on the flank face has an arithmetical mean curvature Spc value at a peak point, as defined by ISO25178, of 5000 or less.

2. The coated cutting tool according to claim 1, wherein the surface of the hard coating formed on the flank face has a maximum height Sz, as defined by ISO25178, of 2.0 μm or less.

3. The coated cutting tool according to claim 2, wherein the surface of the hard coating formed on the flank face has a skewness (Ssk) value, as defined by ISO25178, of −1.5 or more and 0 or less.

4. The coated cutting tool according to claim 1, wherein the surface of the hard coating formed on the flank face has a skewness (Ssk) value, as defined by ISO25178, of −1.5 or more and 0 or less.

* * * * *